United States Patent
Atkinson et al.

(10) Patent No.: US 12,394,905 B2
(45) Date of Patent: Aug. 19, 2025

(54) DONUT-SHAPED CONNECTION PAD FOR PATCH ANTENNA

(71) Applicant: Trimble Inc., Westminster, CO (US)

(72) Inventors: John Kevin Atkinson, Christchurch (NZ); Shawn David Weisenburger, Westminster, CO (US); Gregory Craig Wallace, Westminster, CO (US)

(73) Assignee: Trimble Inc., Westminster, CO (US)

( * ) Notice: Subject to any disclaimer, the term of this patent is extended or adjusted under 35 U.S.C. 154(b) by 169 days.

(21) Appl. No.: 18/230,822

(22) Filed: Aug. 7, 2023

(65) Prior Publication Data
US 2025/0055194 A1    Feb. 13, 2025

(51) Int. Cl.
*H01Q 1/38*    (2006.01)
*H01Q 1/22*    (2006.01)
*H01Q 1/24*    (2006.01)
*H01Q 9/04*    (2006.01)

(52) U.S. Cl.
CPC ......... *H01Q 9/0414* (2013.01); *H01Q 1/2283* (2013.01); *H01Q 1/241* (2013.01)

(58) Field of Classification Search
CPC ............ H01Q 1/288; H01Q 1/36; H01Q 1/38; H01Q 1/42; H01Q 1/422; H01Q 1/48; H01Q 9/0407; H01Q 9/0414; H01Q 21/08; H01Q 21/28
See application file for complete search history.

(56) References Cited

U.S. PATENT DOCUMENTS

| | | | | |
|---|---|---|---|---|
| 5,764,485 A | * | 6/1998 | Lebaschi | H05K 1/113 257/773 |
| 6,124,829 A | * | 9/2000 | Iwasaki | H01Q 9/0428 343/769 |
| 2007/0171138 A1 | * | 7/2007 | Noro | H01Q 1/1214 343/700 MS |
| 2015/0303576 A1 | * | 10/2015 | Latrach | H01Q 9/0464 343/700 MS |
| 2016/0261047 A1 | * | 9/2016 | Wallace | H01Q 5/40 |
| 2020/0266539 A1 | * | 8/2020 | Cooper | H01Q 1/243 |
| 2022/0052434 A1 | * | 2/2022 | Brockett | H01Q 1/38 |

(Continued)

FOREIGN PATENT DOCUMENTS

WO    WO-2014190652 A1 * 12/2014    ........... H01Q 9/0414

OTHER PUBLICATIONS

Extended European Search Report for Application No. 24193245.8-1201, issued Dec. 4, 2024, 12 pages.

(Continued)

*Primary Examiner* — Thai Pham
(74) *Attorney, Agent, or Firm* — Kilpatrick Townsend & Stockton LLP

(57) ABSTRACT

A Global Navigation Satellite System (GNSS) patch antenna can include a set of layers, a set of channels, and a set of conduction pins. The set of layers can include at least one layer with an electrically conductive antenna element configured to receive GNSS signals and another layer including a ground well. The set of channels can be aligned between the set of layers and can extend through the set of layers. The set of conduction pins can be located in the set of channels. Each conduction pin of the set of conduction pins can include a set of vias coupled by one or more donut-shaped connection pads at each interface between the set of layers.

20 Claims, 9 Drawing Sheets

(56) References Cited

U.S. PATENT DOCUMENTS

2022/0216614 A1* 7/2022 Rogers ................ H01Q 15/004
2024/0162617 A1* 5/2024 Batra ...................... H01Q 5/40

OTHER PUBLICATIONS

Ghosh, P., "Designing Staggered and Stacked Vias in PCBs," Sierra Circuits, posted Jun. 8, 2022; 26 pages, retrieved from the internet Nov. 25, 2024: https://www.protoexpress.com/blog/design-manufacture-staggered-and-stacked-vias/.
Volakis, J. L., "A Scheme to Lower the Resonant Frequency of the Microstrip Patch Antenna," IEEE Microwave and Guided Wave Letters, vol. 2, No. 7, Jul. 1992, 2 pages.

* cited by examiner

900

```
┌─────────────────────────────────────┐
│ Form laminates of a patch antenna   │
│ that includes a ground well and a   │
│ set of channels                     │
│ 902                                 │
└─────────────────────────────────────┘
                 │
                 ▼
┌─────────────────────────────────────┐
│ Position a set of conduction pins   │
│ in the set of channels 904          │
└─────────────────────────────────────┘
                 │
                 ▼
┌─────────────────────────────────────┐
│ For each conduction pin, couple     │
│ vias of the conduction pin using    │
│ one or more donut-shaped            │
│ connection pads 906                 │
└─────────────────────────────────────┘
```

FIG. 9

DONUT-SHAPED CONNECTION PAD FOR PATCH ANTENNA

BACKGROUND

This disclosure relates in general to patch antennas that can be used for receiving and/or transmitting electrical signals. Patch antennas can be used, for example, with a global navigation system or other suitable systems to receive data, transmit data, or a combination thereof with respect to the system. Conventional patch antennas may be limited to small ranges of frequencies, intensities, or the like for receiving signals, transmitting signals, or a combination thereof. For example, manufacturing limitations may not allow the conventional patch antennas to receive or transmit signals in desired frequency ranges, intensity ranges, or the like.

SUMMARY

This disclosure relates to patch antennas, and without limitation to a patch antenna that includes conduction pins having vias connected by one or more donut-shaped connection pads. The patch antenna may be configured to be used with respect to a global navigation satellite system (GNSS). The GNSS patch antenna can include a top laminate, a middle laminate, and a bottom laminate, where the ground well is formed on a lower, exposed surface of the center laminate and side and lower, exposed surfaces of the bottom laminate. The top laminate can include at least one electrically conductive antenna element. The at least one electrically conductive antenna element and the ground well can include electrically conductive material such as copper, silver, aluminum, etc. The conduction pins may extend from the electrically conductive antenna element to external circuitry adjacent the ground well, which may be or include a U-shaped ground plane, of the patch antenna. In some examples, the external circuitry may be or include a printed circuit board assembly configured to receive signals from the patch antenna. The one or more connection pads may include an outer connection ring and a set of spokes that allow, for each conduction pin, electrically conductive material of a first via to be coupled in and in electrical communication with electrically conductive material of a second via.

In certain embodiments, a Global Navigation Satellite System (GNSS) patch antenna can include a set of layers, a set of channels, and a set of conduction pins. The set of layers can include at least one layer having an electrically conductive antenna element that can be configured to receive GNSS signals. Another layer of the set of layers can include a ground well. The set of channels can be aligned between the set of layers and can extend through the set of layers. The set of conduction pins can be located in the set of channels. Each conduction pin of the set of conduction pins can include a set of vias coupled by one or more donut-shaped connection pads at each interface between the set of layers.

In an embodiment, the set of layers can include a middle laminate, a top laminate, and a bottom laminate. The middle laminate can include a first side and a second side opposite the first side. The top laminate can be coupled to the middle laminate and can be positioned on the first side of the middle laminate. The bottom laminate can be coupled to the middle laminate and can be positioned on the second side of the middle laminate. Exposed surfaces of the bottom laminate and at least an exposed portion of a surface of the second side of the middle laminate can be plated with an electrically conductive material to form the ground well. In an embodiment, each channel of the set of channels can extend from an electrically conductive antenna element included in the top laminate to a first side of the bottom laminate positioned opposite a second side of the bottom laminate coupled to the second side of the middle laminate. In an embodiment, the electrically conductive antenna element and each conduction pin of the plurality of conduction pins can include an electrically conductive material. The electrically conductive antenna element can have a geometrical shape similar to a geometrical shape of the top laminate and can include copper. In an embodiment, the ground well can increase a volume of the GNSS patch antenna to optimize a detectable frequency range associated with the GNSS patch antenna. In an embodiment, each donut-shaped connection pad of the one or more donut-shaped connection pads can include a set of spokes. Each spoke of the set of spokes can extend from a respective via to an outer radius of the donut-shaped connection pad, and electrically conductive material included in the respective via can be connected to each spoke of the set of spokes. In an embodiment, each conduction pin of the set of conduction pins can be adjacent to but may not contact the ground well. In an embodiment, each adjacent pair of vias included in the set of vias can be connected to one another by a different connection pad of the one or more connection pads.

In another embodiment, a Global Navigation Satellite System (GNSS) patch antenna can include a set of laminate layers and a set of channels. The set of laminate layers can include at least one laminate layer that can include an electrically conductive antenna element configured to receive GNSS signals, and another laminate layer of the set of laminate layers can include a ground well. The set of channels can be aligned between the set of layers and can extend through the set of layers. The set of channels can be sized to receive a set of conduction pins. Each conduction pin of the set of conduction pins can include a set of vias coupled by one or more donut-shaped connection pads at each interface between the set of layers.

In an embodiment, the set of laminate layers can include a middle laminate layer, a top laminate layer, and a bottom laminate layer. The middle laminate layer can include a first side and a second side opposite the first side. The top laminate layer can be coupled to the middle laminate layer and can be positioned on the first side of the middle laminate layer. The bottom laminate layer can be coupled to the middle laminate layer and can be positioned on the second side of the middle laminate layer. Exposed surfaces of the bottom laminate layer and at least an exposed portion of a surface of the second side of the middle laminate layer can be plated with an electrically conductive material to form the ground well. In an embodiment, each channel of the set of channels can extend from the electrically conductive antenna element included in the top laminate layer to a first side of the bottom laminate layer positioned opposite a second side of the bottom laminate layer coupled to the second side of the middle laminate layer. In an embodiment, the electrically conductive antenna element and each conduction pin of the set of conduction pins can include an electrically conductive material. The electrically conductive antenna element can have a geometrical shape similar to a geometrical shape of the laminate layer and can include copper. In an embodiment, the ground well can increase a volume of the GNSS patch antenna to optimize a detectable frequency range associated with the GNSS patch antenna. In an embodiment, each donut-shaped connection pad of the one or more donut-shaped connection pads can include a set of spokes. Each spoke of the set of spokes can extend from a via to an outer radius of the donut-shaped connection pad. Electrically conductive material included in the respective via can be connected to each spoke of the set of spokes. In an embodiment, each conduction pin of the set of conduction pins can be adjacent to but may not contact the ground well. In an embodiment, each adjacent pair of vias included in the plurality of vias can be connected to one another by a different connection pad of the one or more connection pads.

In yet another embodiment, a connection pad can be used for a Global Navigation Satellite System (GNSS) patch antenna. The connection pad can include an outer connection ring and a set of spokes. The outer connection ring can have an inner radius and an outer radius. Each spoke of the set of spokes can be coupled to and can extend from the inner radius of the outer connection ring. The set of spokes can be configured to allow the connection pad to connect a pair of vias included in a conduction pin of the GNSS patch antenna.

In an embodiment, the connection pad can additionally include a solder ring that can be positioned on the inner radius of the outer connection ring. The solder ring can be configured to prevent electrical interaction between the connection pad and the conduction pin. In an embodiment, each spoke of the set of spokes can include a first end and a second end. The first end of each spoke can be coupled to the inner radius of the outer connection ring, and the second end of each spoke of the set of spokes can be coupled to an outer radius of the pair of vias of the conduction pin. In an embodiment, the outer connection ring can be embedded in a transition region of a first laminate layer of the GNSS patch antenna, and the connection pad can be configured to connect a first via of the conduction pin positioned in the first laminate layer to a second via of the conduction pin. The second via can be positioned in a second laminate layer of the GNSS patch antenna.

Further areas of applicability of the present disclosure will become apparent from the detailed description provided hereinafter. It should be understood that the detailed description and specific examples, while indicating various embodiments, are intended for purposes of illustration only and are not intended to limit the scope of the disclosure.

BRIEF DESCRIPTION OF THE DRAWINGS

The present disclosure is described in conjunction with the appended figures.

FIG. 9 depicts a flowchart of a process for connecting vias with one or more connection pads to form a conduction pin of the patch antenna of FIG. 2 according to an embodiment.

Figure 1:
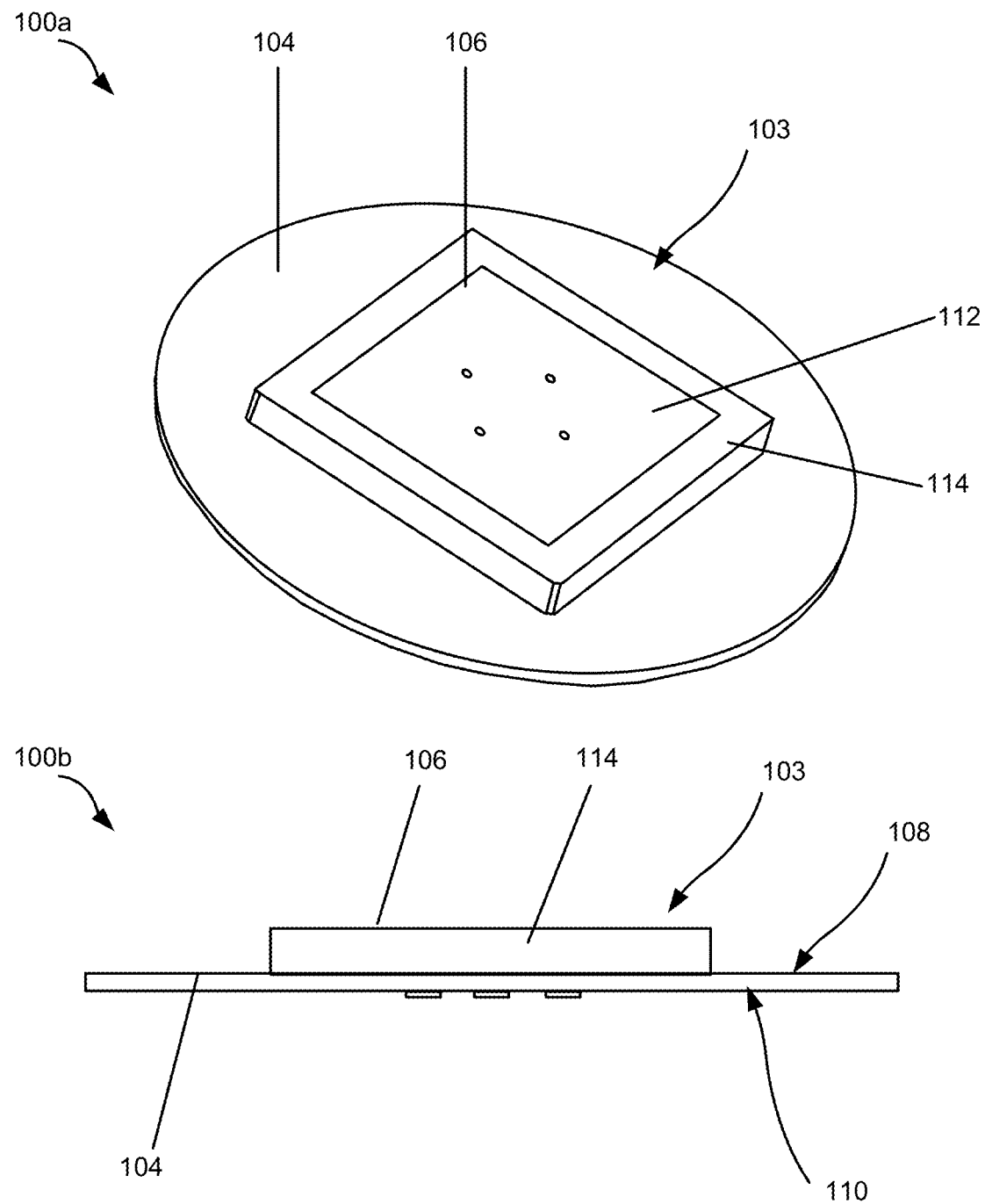
FIG. 1 depicts a perspective view and a side view of a patch antenna.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

This disclosure, without limitation, relates to a donut-shaped connection pad for a patch antenna. The donut-shaped connection pad may be configured to connect one or more electrically conductive portions of the patch antenna. For example, the connection pad may connect two or more vias, which may be connected to form a common conduction pin that can be included in the patch antenna. The two or more vias, once connected using the connection pad, may form a continuous electrical conduction path (e.g., following the path of the conduction pin) through at least a portion of the patch antenna. The connection pad may include or otherwise involve solder, epoxy, or other materials or techniques to connect the two or more vias. For example, the connection pad may include a set of spokes that may each extend from approximately an outer radius of the two or more vias to at least an inner radius of the connection pad. The set of spokes may be positioned in a region in which solder, epoxy, or the like may be deposited to connect the two or more vias to one another, to an outer connection ring of the connection pad, or a combination thereof. Additionally, the connection pad may include a mask that may prevent solder, epoxy, or the like from contacting the masked regions. The masked regions may allow electrical conductivity between the two or more vias and may allow the conduction pin to be conductive, for example as if the conduction pin were monolithic.

In some embodiments, the patch antenna may include the set of conduction pins and a ground well for receiving and/or transmitting signals. The signals may originate and/or terminate at a communication system, such as a global navigation satellite system (GNSS), though other suitable communication systems, such as radio transmission systems, computer systems, and the like can be used with respect to the patch antenna. The patch antenna may include a bottom laminate, a middle laminate, a top laminate, and any other suitable layers, components, or combinations thereof for the patch antenna. The ground well may include or be formed by one or more portions of the middle laminate, one or more portions of the bottom laminate, etc. For example, the ground well may be formed by lower, exposed portions of the bottom laminate, side and lower, exposed portions of the middle laminate, or a combination thereof.

The middle laminate, the top laminate, the bottom laminate, other layers of the patch antenna, or any combination thereof may be coupled to one another. For example, the top laminate may be positioned abutting and coupled with a first side of the middle laminate, and the bottom laminate may be positioned abutting and coupled with a second side of the middle laminate opposite the first side. The top laminate of the patch antenna may include an electrically conductive antenna element that can receive signals from a communication system. In a particular example, the top laminate can include at least one electrically conductive antenna element that can receive GNSS signals. In another example, the top laminate can include a first electrically conductive antenna element positioned on a first side of a laminate (e.g., dielectric) material of the top laminate, and a second electrically conductive antenna element positioned on a second side opposite the first side of the laminate material of the top laminate.

In some embodiments, the bottom laminate of the patch antenna can include one or more exposed surfaces and one or more non-exposed surfaces. The one or more non-exposed surfaces may be positioned abutting the middle laminate, and the one or more exposed surfaces may be positioned opposite the one or more non-exposed surfaces and facing away from the middle laminate. In a particular example, the one or more exposed surfaces may form or otherwise be included in a bottom surface of the patch antenna such that the bottom surface may be or include the ground well. Additionally or alternatively, the one or more exposed surfaces may be or include an electrically conductive material. For example, the one or more exposed surfaces may include a plated, exterior layer of the electrically conductive material. Examples of the electrically conductive material can include copper, silver, aluminum, titanium, other electrically conductive elements, any alloys thereof, or any combination thereof. In some embodiments, the ground well, or any other suitable exterior surface, of the patch antenna may include the one or more exposed portions of the bottom laminate and one or more exposed portions of the middle laminate. In these embodiments, the one or more exposed portions of the bottom laminate and the one or more exposed portions of the middle laminate may include at least an exterior surface of plated material. The exterior surface of plated material may be or include the electrically conductive material.

In some embodiments, the patch antenna, for example each component thereof, may include the set of channels extending from a first side of the patch antenna to a second side, opposite the first side, of the patch antenna. A channel is a hole extending through one or more laminates of the patch antenna, and a via is a hole in a laminate that is filled or plated with a conductive material to form a conduction pin. Each channel of the set of channels may be hollow and sized to receive one or more conduction pins. The first side may be adjacent to or coincide with the at least one electrically conductive antenna element of the top laminate, and the second side may be adjacent to or coincide with the ground well, the component thereof contributed by the bottom laminate. In a particular example, each channel of the set of channels, or any subset thereof, can extend from the top laminate, or the electrically conductive antenna element thereof, to the one or more exposed surfaces of the bottom laminate, of the patch antenna. Additionally, each channel of the set of channels, or any other subset thereof, may be hollow and/or sized to receive a different conduction pin of the set of conduction pins. The set of conduction pins may include a number of conduction pins similar or identical to a number of channels of the set of channels. Additionally, each conduction pin of the set of conduction pins may be positioned in a different channel of the set of channels to conduct signals between the at least one electrically conductive antenna element and the ground well or any device connected thereto. In some embodiments, each conduction pin of the set of conduction pins may include two or more vias. A via may be or include at least a portion of the respective conduction pin. For example, a particular conduction pin can include three separate vias coupled by one or more donut-shape connection pads to form the particular conduction pin, though any other number (e.g., less than three or more than three) of vias can be used to form the particular conduction pin. While described and illustrated for use with one possible example of a patch antenna having a ground well, one of ordinary skill in the art would appreciate that the connection pad described herein can be used with any suitable patch antenna having one or more laminates and two or more vias.

In some embodiments, a donut-shaped connection pad may include an outer connection ring, a set of spokes, and a solder ring, though the donut-shaped connection pad may include other or additional components. The outer connection ring may be shaped as a washer (e.g., a circular, oval, or other round-shaped disk with a concentric hole in the middle), though other suitable shapes can be used for the outer connection ring. An inner diameter of the outer connection ring may be larger than an outer diameter of adjacent vias to be connected by the connection pad. The set of spokes may include one spoke, two spokes, three spokes, four spokes, five spokes, or more spokes. Additionally, each spoke of the set of spokes may extend at least from the outer diameter of the vias to the inner diameter of the outer connection ring. The solder ring may be positioned between the outer connection ring and the vias. For example, an inner diameter of the solder ring may be positioned adjacent to the outer diameter of the vias, and an outer diameter of the solder ring may be positioned adjacent to the inner diameter of the outer connection ring. Additionally, the solder ring may be used to connect the vias to the outer connection ring using the set of spokes. For example, (i) the solder ring may include epoxy or other chemical adhesives configured to couple the spokes to the vias and to the outer connection ring, (ii) the solder ring may facilitate soldering the spokes to the vias and to the outer connection ring, etc.

The patch antenna with the ground well and the set of conduction pins with donut-shaped connection pads can be used for various applications. In one particular example, the patch antenna may be or include a GNSS patch antenna that can be configured to receive signals from a GNSS transmitter. The GNSS transmitter, which in some examples may be positioned in a satellite or may be communicatively coupled with the satellite, may transmit one or more signals, and the GNSS patch antenna may receive the one or more signals, for example via the electrically conductive antenna element, the set of conduction pins, or the like.

In another example, the patch antenna may be included in a set of antenna patches that can be positioned on a common antenna board. The common antenna board can include a common (e.g., single) middle laminate that may be shared among each antenna patch included in the set of antenna patches, or any subset thereof. Additionally, each patch antenna may include a different top laminate, a different bottom laminate, different conduction pins, and different connection pads compared to other patch antennas of the set of patch antennas. The common antenna board may be sized, shaped, or otherwise dimensioned to receive one or more signals from a transmitter. The transmitter can transmit the one or more signals toward the common antenna board (e.g., the transmitter can be communicatively coupled with the set of antennas of the common antenna board) or can otherwise suitably transmit the one or more signals such that the set of antenna patches can receive the one or more signals. The transmitter can be or include a radio transmitter, a computer transmitter, or any other suitable transmitter that can transmit the one or more signals that can be detected or otherwise received by the set of antenna patches.

In some embodiments, the structure of the patch antenna may provide various functional improvements for the patch antenna. In a particular example, the combination of the top laminate, the middle laminate, and the bottom laminate, along with the ground well, the set of conduction pins, and the like can allow impedance of received signals to be processed or otherwise controlled with the patch antenna and without transmitting the received signals to a separate board. Additionally, the ground well of the patch antenna may provide an increased or optimized (e.g., compared to other patch antennas) volume of the patch antenna that can optimize (e.g., increase) a frequency range of signals that the patch antenna can receive.

The following illustrative examples are presented to introduce the reader to the general subject matter discussed herein and are not intended to limit the scope of the disclosed concepts. The following sections describe various additional features and examples with reference to the drawings in which like numerals indicate like elements and directional descriptions are used to describe the illustrative aspects but, like the illustrative aspects, should not be used to limit the present disclosure. Additionally, the presented figures are generally described with respect to computer modeling operations, but the general subject matter discussed herein is not limited to computer modeling operations.

Referring first to FIG. 1, a perspective view 100a and a side view 100b of a patch antenna 103 is depicted. As illustrated, the patch antenna 102 includes a middle laminate 104, which may be or include a ground plane, such as a planar ground plane, and a top laminate 106, though the patch antenna 102 may include additional or alternative components or combinations of components. The middle laminate 104 can include a first side 108 and a second side 110. The second side 110 may be positioned opposite the first side 108. Additionally, the middle laminate 104 may be or include electrically conductive material. In a particular example, an exterior, plated layer of the middle laminate may be or include electrically conductive material such as copper, silver, aluminum, titanium, any other conductive element, any alloy thereof, or any combination thereof.

The top laminate 106 may be positioned on or otherwise abutting the first side 108 of the middle laminate 104. For example, the top laminate 106 may be coupled (e.g., mechanically, chemically, etc.) to the first side 108 of the middle laminate 104, may be formed integrally with respect to the first side 108 of the middle laminate 104, or the like. Additionally, the top laminate 106 may include an electrically conductive antenna element 112, a laminate portion 114, and any other suitable component for the top laminate 106. The electrically conductive antenna element 112, or any other suitable component of the patch antenna 102, can be positioned to receive one or more signals, for example from a transmitter of or communicatively coupled with a global navigation satellite system (GNSS). In some embodiments, the electrically conductive antenna element 112 may define a first shape that may be geometrically similar to a second shape defined by the top laminate 106. In a particular example, the electrically conductive antenna element 112 may be a square, and the top laminate 106 may also be a square that is at least slightly larger than the square of the electrically conductive antenna element 112. Although described as a square, the electrically conductive antenna element 112 and/or the top laminate 106 may be or include other suitable shapes such as rectangles, ovals, circles, irregular shapes, etc.

The electrically conductive antenna element 112 may be or include electrically conductive material such as copper, silver, aluminum, titanium, any other conductive element, any alloy thereof, or any combination thereof. In one particular example, the electrically conductive antenna element 112 may be or include copper or copper alloy, and the middle laminate 104 may be or include the same or similar copper or copper alloy. Additionally, the laminate portion 114 of the top laminate 106 may be or include a non-metallic material that may be electrically insulating. For example, the laminate portion 114 of the top laminate 106 may be or include a ceramic material, an electrically insulating polymeric material, laminate materials, one or more dielectric materials, other non-conductive materials, or any combination thereof. The laminate portion 114 may be formed integrally with, or otherwise mechanically or chemically coupled with, the electrically conductive antenna element 112 to form the top laminate 106.

Figure 2:
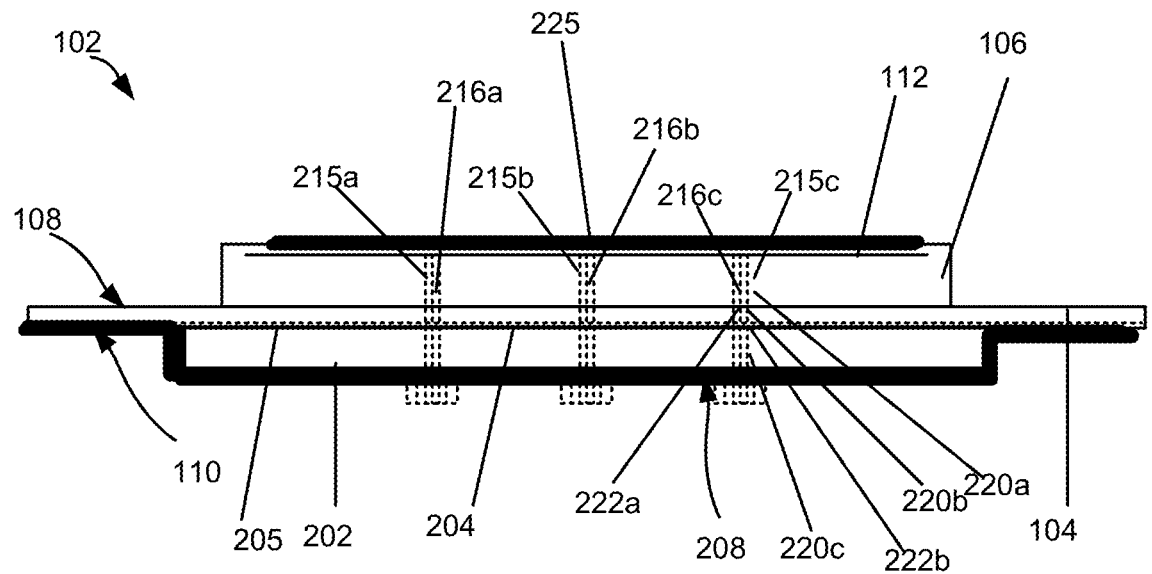
FIG. 2 depicts a sectional side view of a patch antenna with a ground well according to an embodiment.

FIG. 2 is a sectional side view 200 of a patch antenna 102 with a ground well 208 according to an embodiment. As illustrated, the patch antenna 102 can include the bottom laminate 202, a middle laminate 104, and a top laminate 106, though the patch antenna 102 can include additional or alternative components for receiving GNSS or other suitable signals. The middle laminate 104 may include the first side 108 and the second side 110 positioned opposite the first side 108. Additionally, the top laminate 106 may be positioned on or otherwise abutting the first side 108 of the middle laminate 104.

The bottom laminate 202, or the ground well 208, may increase (e.g., compared to other patch antennas) a volume of the patch antenna 102 to optimize a detectable frequency range associated with the patch antenna 102. The ground well 208 may be or include a ground plane disposed on a bottom or lower surface of the patch antenna 102 and that can isolate the laminates of the patch antenna 102. The bottom laminate 202 may be positioned on or abutting the second side 110 of the middle laminate 104. For example, one or more non-exposed portions 204 of the bottom laminate 202 may be positioned on or otherwise coupled with at least a portion 205 (e.g., a central portion) of the second side 110 of the middle laminate 104. The portion 205 of the second side 110 of the middle laminate 104 may be free from electrically conductive material, may be partially coated or plated with an electrically non-conductive material, or the like. One or more exposed portions 206 of the bottom laminate 202 may be positioned or otherwise arranged facing away from or distal with respect to the second side 110 of the middle laminate 104. For example, the one or more exposed portions 206 of the bottom laminate 202 may form or be included in the ground well 208 of the patch antenna 102. In a particular example, the one or more exposed portions 206 of the bottom laminate 202 may form a first component 210a of the ground well 208 of the patch antenna 102, and one or more exposed portions 212 of the middle laminate 104 may form a second component 210*b* of the ground well 208 of the patch antenna 102. Additionally, the ground well 208 may be positioned adjacent or otherwise proximate to external circuitry (e.g., a printed circuit board assembly) that can process or otherwise receive signals received by the patch antenna 102.

Additionally, the top laminate 106 may include one electrically conductive antenna element, two electrically conductive antenna elements, or more electrically conductive antenna elements. In a particular example, and as illustrated in FIG. 2, the top laminate 106 of the patch antenna 102 can include the electrically conductive antenna element 112 and a second electrically conductive antenna element 225. The electrically conductive antenna element 112 and a second electrically conductive antenna element 225 may be separated by a dielectric layer or other type of laminate material layer.

In some embodiments, the patch antenna 102 can include one or more channels 215 such as channels 215*a-c*. While the sectional side view 200 of FIG. 2 illustrates three channels, any suitable number of channels (e.g., less than three or more than three) can be included in the patch antenna 102. Each channel of the channels 215*a-c* may extend from a first end of the patch antenna 102 to a second end of the patch antenna 102. In a particular example, each channel of the channels 215*a-c* may extend from the electrically conductive antenna element 112, or the second electrically conductive antenna element 225, which may be included in the top laminate 106, to the ground well 208, or any portion (e.g., the first component 210*a*) thereof, of the patch antenna 102. Each channel of the channels 215*a-c* may be substantially similar or identical to one another. For example, each channel of the channels 215*a-c* may define a similar or identical radius with respect to other channels of the channels 215*a-c*, may define a similar or identical length with respect to other channels of the channels 215*a-c*, may have similar or identical numbers and/or types of components, such as vias, with respect to other channels of the channels 215*a-c*, and the like. In other embodiments, one or more channels of the channels 215*a-c* may have one or more different dimensions or other properties with respect to other channels of the channels 215*a-c*.

Additionally, each channel of the channels 215*a-c* may be sized, oriented, or otherwise arranged to receive a different conduction pin of conduction pins 216*a-c*. For example, each channel of the channels 215*a-c*, or any subset thereof, can be hollow and sized to receive a respective conduction pin of the conduction pins 216*a-c*. As illustrated in the sectional side view 200, the conductions pins 216*a-c* include three conduction pins, though other suitable numbers (e.g., less than three or more than three) of conduction pins may be included in the patch antenna 102. Each conduction pin of the conduction pins 216*a-c* may be positioned in a different channel of the channels 215*a-c*. For example, conduction pin 216*a* may be positioned in channel 215*a*, conduction pin 216*b* may be positioned in channel 215*b*, and conduction pin 216*c* may be positioned in channel 215*c*, though any permutation thereof may be possible. In some embodiments, positioning a conduction pin in a channel may involve positioning the conduction pin in the channel without having the conduction pin physically contact the channel. For example, the conduction pins 216*a-c* may each be coupled (e.g., mechanically, chemically, etc.) to (i) the electrically conductive antenna element 112, and/or the second electrically conductive antenna element 225, and/or (ii) an external circuit such as a printed circuit board or a printed circuit board assembly. In a particular example, (i) each conduction pin of the conduction pins 216*a-c* can be coupled to the second electrically conductive antenna element 225, and (ii) the conduction pins 216*a-c* may be coupled with an external printed circuit board assembly configured to receive and process GNSS signals from the patch antenna 102.

In some embodiments, each conduction pin of the conduction pins 216*a-c* may include a set of vias that can be connected by one or more connection pads. In a particular example, the conductions pin 216*c* can include vias 220*a-c*, which can be connected together using connection pads 222*a-b*. Via 220*a* can be connected to via 220*b* using connection pad 222*a*, and via 220*b* can be connected to via 220*c* using connection pad 222*b*. For example, respective vias of the vias 220*a-c* can be soldered to respective connection pads of the connections pads 222*a-b* such that the conduction pin 216*c* does not electrically contact the ground well 208 or electrically conductive elements in the middle laminate 104 or electrically conductive elements in the bottom laminate 202. In some embodiments, the conduction pins 216*a-c* may have similar or identical diameters, though one or more conduction pins of the conduction pins 216*a-c* may have a different diameter than other conduction pins of the conduction pins 216*a-c*. Additionally, a diameter of each conduction pin of the conduction pins 216*a-c*, or any via thereof, can be approximately 1 mm, 2 mm, 3 mm, 4 mm, 5 mm, 6 mm, 7 mm, or more.

Figure 3:
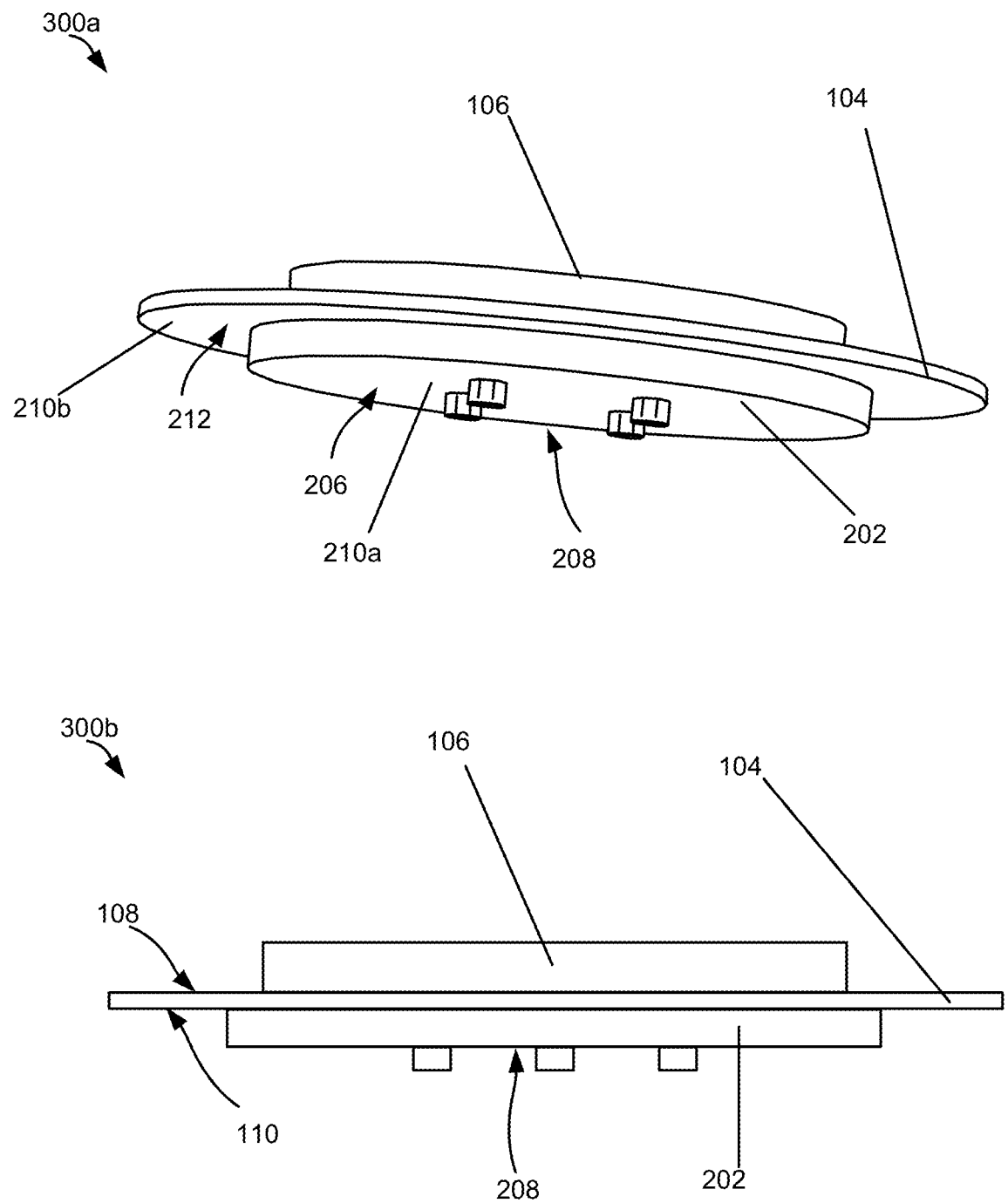
FIG. 3 depicts a perspective view and a side view of a patch antenna with a ground well according to an embodiment.

FIG. 3 is a perspective view 300*a* and a side view 300*b* of the patch antenna 102 with the ground well 208 according to an embodiment. As illustrated, the patch antenna 102 can include the bottom laminate 202, the middle laminate 104, and the top laminate 106, though the patch antenna 102 can include additional or alternative components for receiving GNSS or other suitable signals. The middle laminate 104 may include the first side 108 and the second side 110 positioned opposite the first side 108. Additionally, the top laminate 106 may be positioned on or otherwise abutting the first side 108 of the middle laminate 104. In some embodiments, a distance, which can be measured from the bottom laminate 202 to the top laminate 106 may be less than or approximately 4 mm, 6 mm, 8 mm, 10 mm, 12 mm, 14 mm, 16 mm, 18 mm, 20 mm, etc. For example, the middle laminate 104, the top laminate 106, and the bottom laminate 202 may each be less than or approximately 2 mm, 3 mm, 4 mm, 5 mm, 6 mm, 7 mm, 8 mm, 9 mm, etc. in thickness. The middle laminate 104, the top laminate 106, and the bottom laminate 202 may have similar or identical height or other dimensions, or the middle laminate 104, the top laminate 106, and the bottom laminate 202 may have differing heights or other dimensions.

In some embodiments, the middle laminate 104 can define a first three-dimensional shape, the top laminate 106 can define a second three-dimensional shape, and the bottom laminate 202 can define a third three-dimensional shape. Additionally, at least two dimensions of each of the first three-dimensional shape, the second three-dimensional shape, and the third three-dimensional shape may be geometrically similar. In a particular example, for example as illustrated in FIG. 3, the middle laminate 104, the top laminate 106, and the bottom laminate 202 may define a first cylinder, a second cylinder, and a third cylinder, respectively. The first cylinder, the second cylinder, and the third cylinder may have different heights, different radii, or other different dimensions but may otherwise have other dimensions that are substantially the same or similar with respect to one another. While described and illustrated as cylinders (or cylinder-like shapes), the middle laminate 104, the top laminate 106, and/or the bottom laminate 202 may be or otherwise define other suitable shapes such as cubes, rectangular prisms, irregular three-dimensional shapes, and the like.

The bottom laminate 202 may increase (e.g., compared to other patch antennas) a volume of the patch antenna 102 to optimize a detectable frequency range associated with the patch antenna 102. The bottom laminate 202 may be positioned on or abutting the second side 110 of the middle laminate 104. For example, one or more non-exposed portions 204 of the bottom laminate 202 may be positioned on or otherwise coupled with at least the portion 205, which may be free from electrically conductive material, may be partially coated or plated with an electrically non-conductive material, or the like. One or more exposed portions 206 of the bottom laminate 202 may be positioned or otherwise arranged facing away from or distal with respect to the second side 110 of the middle laminate 104. For example, the one or more exposed portions 206 of the bottom laminate 202 may form or be included in the ground well 208 of the patch antenna 102. In a particular example, the one or more exposed portions 206 of the bottom laminate 202 may form the first component 210a of the ground well 208 of the patch antenna 102, and one or more exposed portions 212 of the middle laminate 104 may form the second component 210b of the ground well 208 of the patch antenna 102. Additionally, the bottom laminate 202 may be positioned adjacent or otherwise proximate to external circuitry (e.g., a printed circuit board assembly) that can process or otherwise receive signals received and/or transmitted by the patch antenna 102.

In some embodiments, the ground well 208, or any component thereof, such as the one or more exposed portions 206 of the bottom laminate 202, the one or more exposed portions 212 of the middle laminate 104, or a combination thereof, may be or include a conductive material. For example, the one or more exposed portions 206 of the bottom laminate 202, the one or more exposed portions 212 of the middle laminate 104, or a combination thereof may be or include electrically conductive material such as copper, silver, aluminum, titanium, any other conductive element, any alloy thereof, one or more conductive polymeric materials, or any combination thereof. In some embodiments, the one or more exposed portions 206 of the bottom laminate 202 and the one or more exposed portions 212 of the middle laminate 104 can be formed from or include similar or identical material. In a particular example, the one or more exposed portions 206 of the bottom laminate 202 and the one or more exposed portions 212 of the middle laminate 104 can include copper or a copper alloy. In another particular example, and the one or more exposed portions 206 of the bottom laminate 202 and the one or more exposed portions 212 of the middle laminate 104 can be plated with similar or identical material during a common process to manufacture the patch antenna 102.

Figure 4:
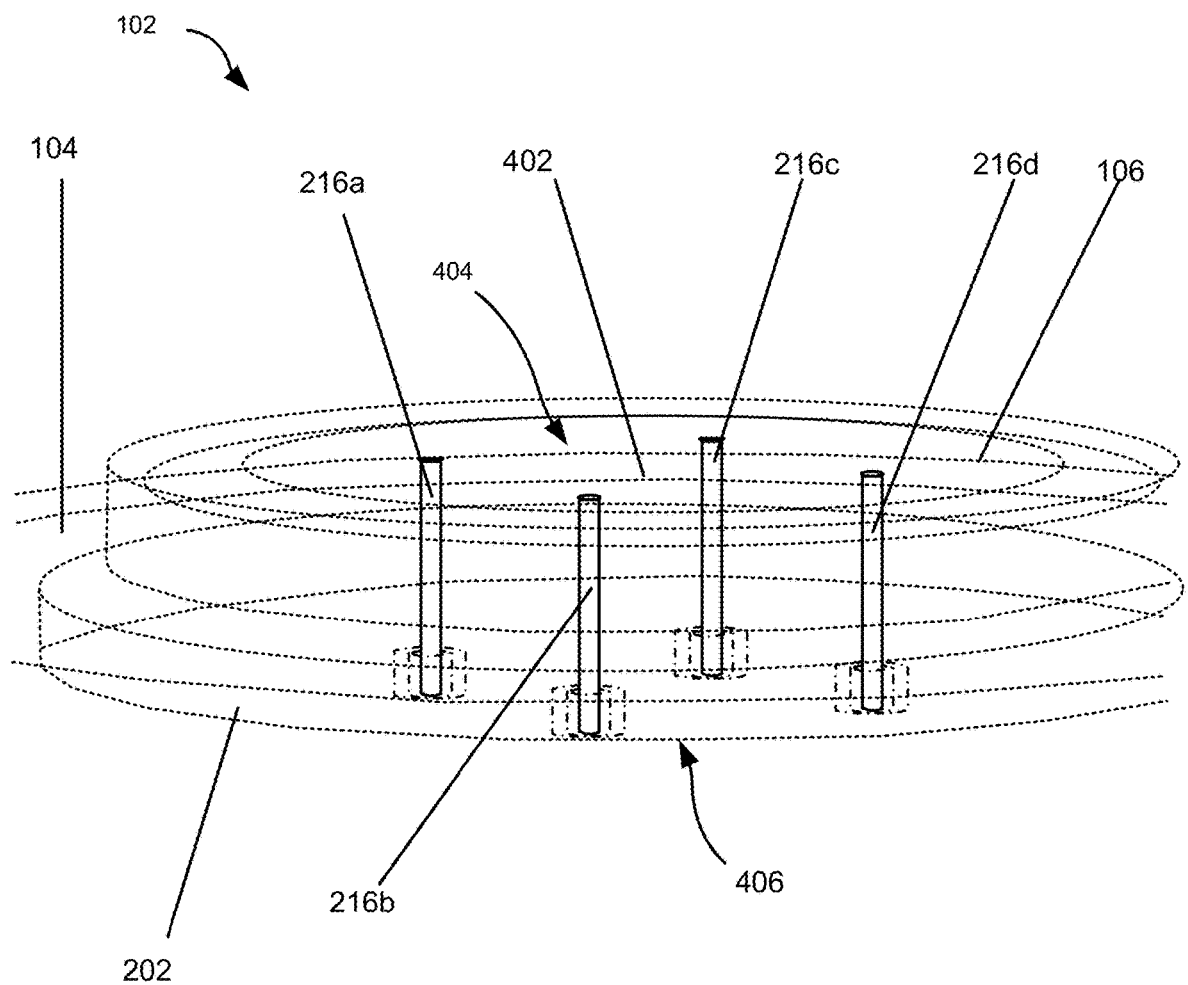
FIG. 4 depicts a perspective view of a set of conduction pins of the patch antenna of FIG. 2 according to an embodiment.
Figure 5:
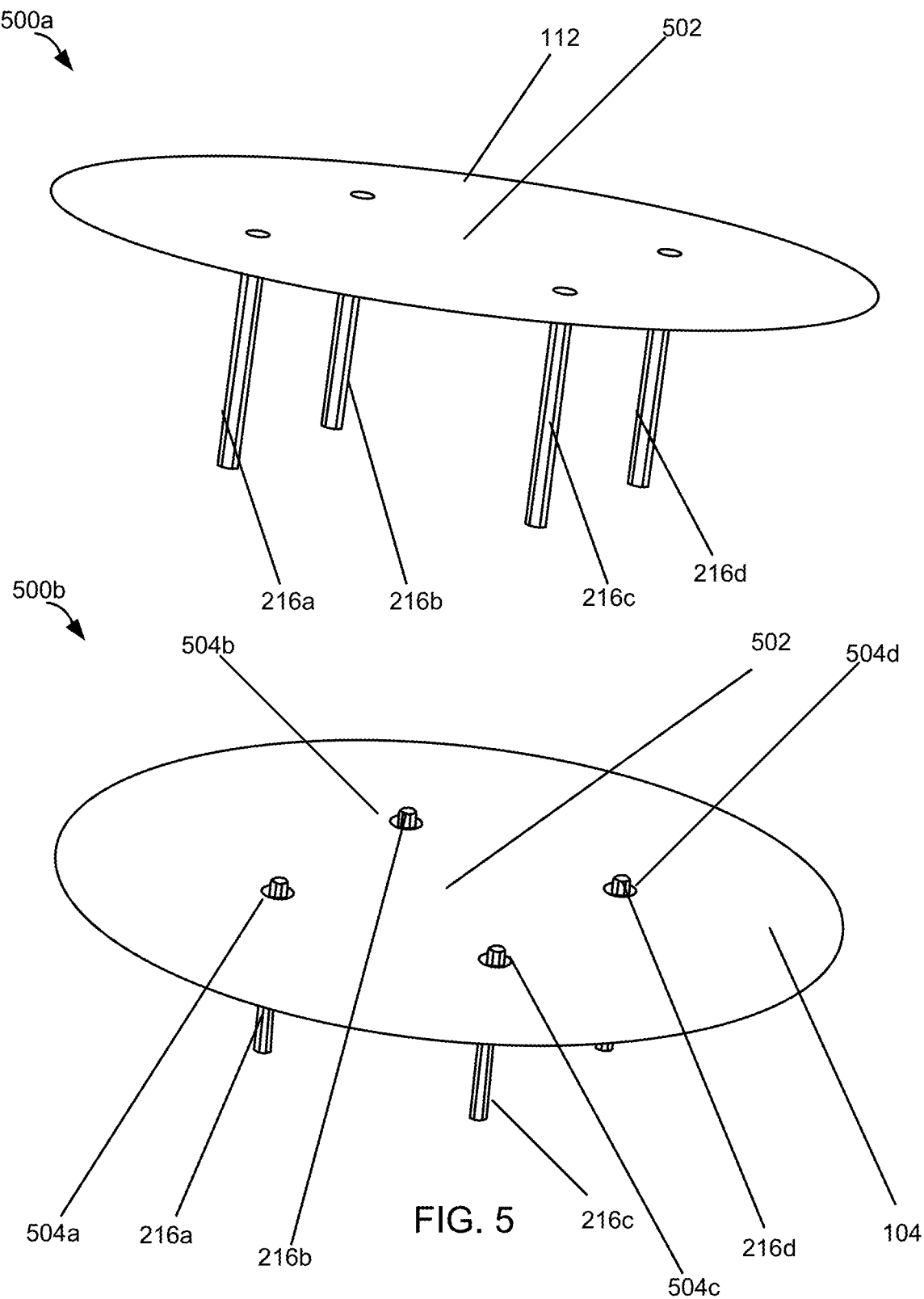
FIG. 5 depicts a set of perspective views of a set of conduction pins and components of the patch antenna of FIG. 2 according to an embodiment.

FIG. 4 is a perspective view of a set of conduction pins 216a-d of the patch antenna 102 according to an embodiment, and FIG. 5 is a set of perspective views 500a-b of a set of conduction pins 216a-d and components of the patch antenna 102 according to an embodiment. As illustrated, the patch antenna 102 can include four conduction pins 216a-d, though any other suitable number (e.g., less than four or more than four) of conduction pins may be included in the patch antenna 102. Additionally, the set of conduction pins 216a-d are illustrated as being arranged in approximately a square shape around a central point 402 of the top laminate 106 of the patch antenna 102, or around a central point 502 of the middle laminate 104 or the electrically conductive antenna element 112, but the set of conduction pins 216a-d can otherwise suitably be arranged in the patch antenna 102 to optimize, for example, a detection frequency range of the patch antenna 102. For example, the set of conduction pins 216a-d can be arranged in approximately a circle shape, an oval shape, a rectangular shape, irregular shapes, or the like around the central point 402 or around the central point 502.

As illustrated, each conduction pin of the set of conduction pins 216a-d can extend from a first end 404 of the patch antenna 102 to a second end 406 of the patch antenna 102. In some embodiments, the first end 404 of the patch antenna 102 may be near or adjacent to an outer surface of the patch antenna 102. For example, the first end 404 may approximately coincide with the electrically conductive antenna element 112 or the second electrically conductive antenna element 225 of the top laminate 106. Additionally, the second end 406 of the patch antenna 102 may approximately coincide with an exterior (e.g., outwardly facing) surface of the bottom laminate 202 such as one or more portions of the ground well 208. In a particular example, each conduction pin of the conduction pins 216a-d may extend from the first end 404 of the patch antenna 102 to the second end 406 of the patch antenna 102.

In some embodiments, each conduction pin of the set of conduction pins 216a-d can extend from the electrically conductive antenna element 112 and through the middle laminate 104, for example from the first end 404 of the patch antenna 102 to the second end 406 of the patch antenna 102. In a particular example, each conduction pin of the set of conduction pins 216a-d may be coupled in electrical communication with the electrically conductive antenna element 112. Additionally, while the set of conduction pins 216a-d is illustrated as being arranged approximately in a square shape around the central point 402 and the central point 502, the set of conduction pins 216a-d can be otherwise suitably arranged. For example, the set of conduction pins 216a-d may be arranged approximately in a circle about the central point 402 or the central point 502, a rectangle about the central point 402 or the central point 502, irregularly spaced about the central point 402 or the central point 502, arranged about a different point or different set of points, etc. In some embodiments, one or more conduction pins of the set of conduction pins 216a-d may extend through the middle laminate 104 and/or the bottom laminate 202 without electrically contacting the middle laminate 104, the bottom laminate 202, or any components or portions of either.

Figure 6:
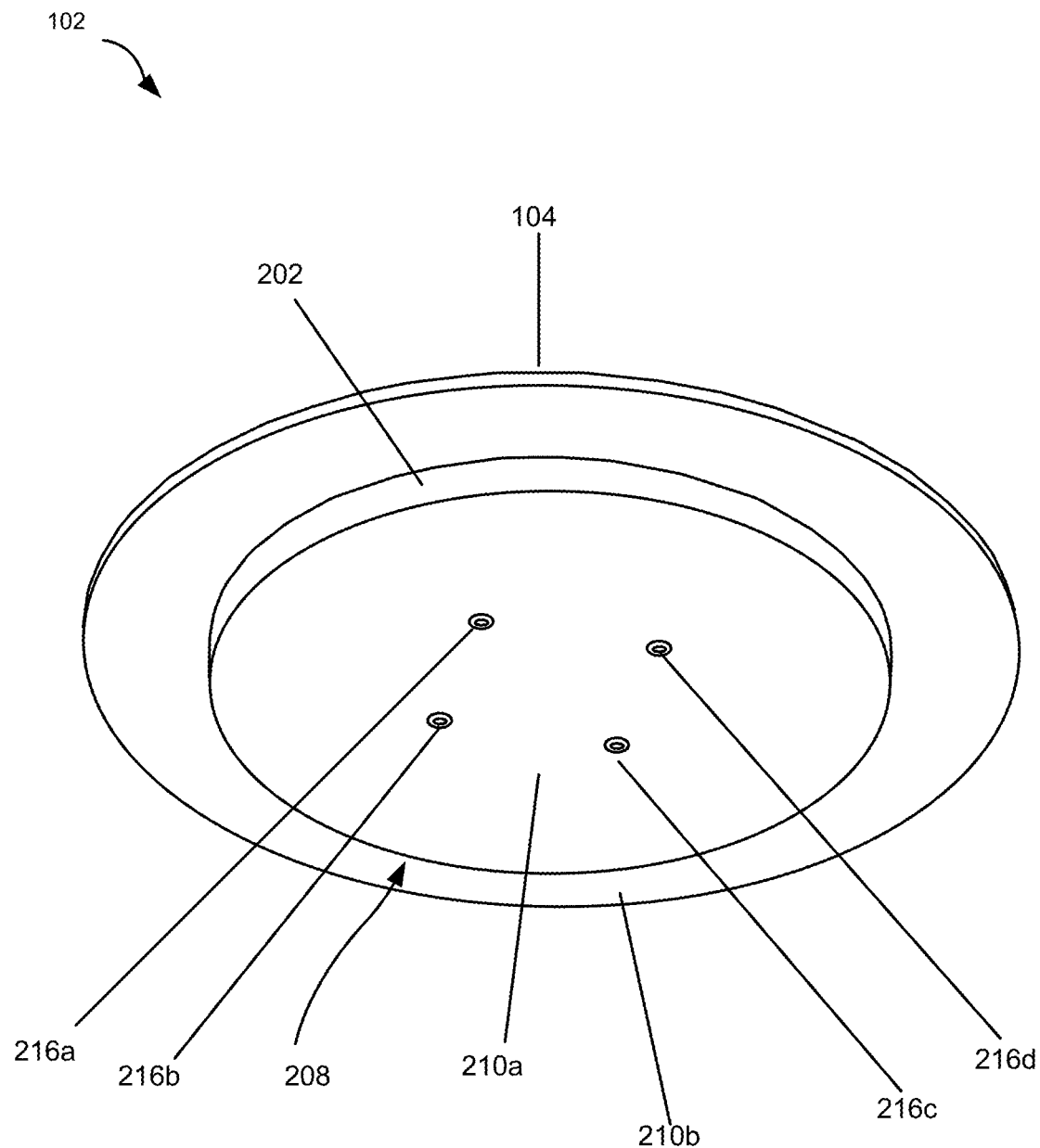
FIG. 6 depicts a bottom perspective view of the patch antenna of FIG. 2 according to an embodiment.

FIG. 6 is a bottom perspective view of the patch antenna 102 according to an embodiment. As illustrated in FIG. 6, the patch antenna 102 can include the middle laminate 104 and the bottom laminate 202, though the patch antenna 102 may additionally or alternatively include any other suitable component or combination of components. Additionally, the patch antenna 102 can include the set of conduction pins 216a-d that can be arranged around the central point 502. The ground well 208 can include the first component 210a, which may be contributed by an exterior surface of the bottom laminate 202, and the second component 210b, which may be contributed by an exterior surface of the middle laminate 104 oriented in the same or similar direction as the exterior surface of the bottom laminate 202.

In some embodiments, the first component 210a and the second component 210b may form a monolithic electrical ground for the patch antenna 102. For example, the ground well 208, which may include the first component 210a and the second component 210b, may be or include a continuous surface plated with or otherwise including an electrically conductive material that can function as a ground for the patch antenna 102. The ground well 208 may define a cross-sectional shape that can include a U shape, a step shape, or other suitable shape for the cross section of the ground well 208.

Figure 7:
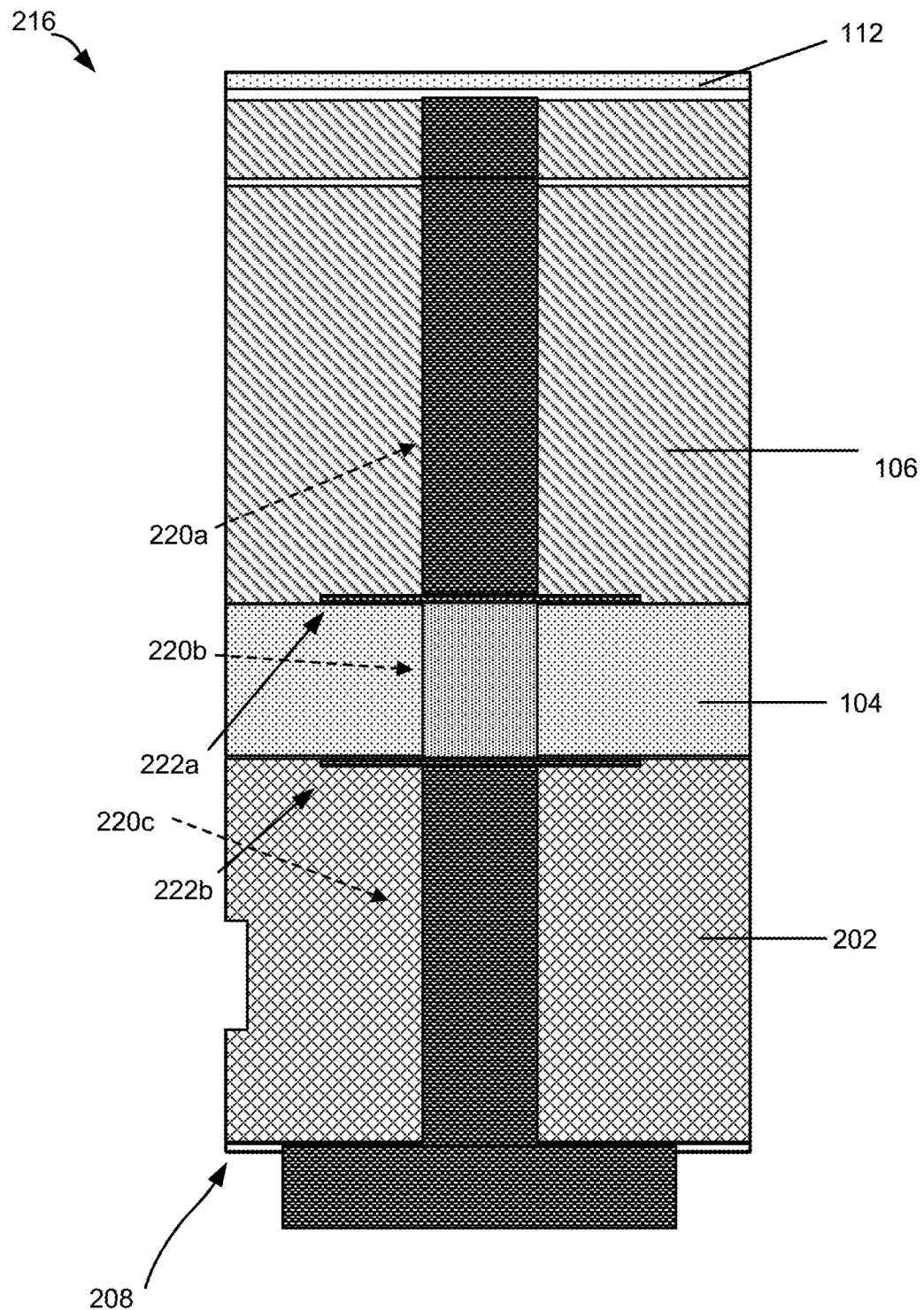
FIG. 7 depicts a side view of a conduction pin and one or more donut-shaped connection pads of the patch antenna of FIG. 2 according to an embodiment.

FIG. 7 is a side view of a conduction pin 216 and one or more donut-shaped connection pads of the patch antenna 102 according to an embodiment. As illustrated, the conduction pin 216 can include vias 220a-c and connection pads 222a-b, though other or additional suitable components may be included in the conduction pin 216. In a particular example, such as illustrated in FIG. 7, the conduction pin 216 can extend from the electrically conductive antenna element 112 to the ground well 208 or other suitable base of the patch antenna 102. Additionally or alternatively, the conduction pin 216 can extend from the electrically conductive antenna element 112, through the top laminate 106, through the middle laminate 104, and through the bottom laminate 202, terminating at the ground well 208 or at a bottom portion of the bottom laminate 202.

In some embodiments, the vias 220a-c can be connected by the connections pads 222a-b, which may be or include donut feed pads or donut-shaped feed pads. Each connection pad of the connection pads 222a-b can be or include a donut-shaped connection pad that includes an out connection ring, a solder ring, and a set of spokes. Additionally, each via of the vias 220a-c may include electrically conductive material that may be configured to carry received signals from the electrically conductive antenna element 112 to the ground well 208 or to external circuitry such as a printed circuit board assembly. Examples of the electrically conductive material may be or include copper, silver, aluminum, titanium, alloys thereof, conductive polymers, or any combination thereof.

In some embodiments, the via 220a may be connected to the via 220b using the connection pad 222a, and the via 220b may be connected to the via 220c using the connection pad 222b, though any suitable permutation thereof may be possible. For example, the via 220a and the via 220b can be connected to the connection pad 222a, and the via 220b and the via 220c can be connected to the connection pad 222b. Additionally or alternatively, each pair of vias of the vias 220a-c may be connected to a respective connection pad of the connection pads 222a-b at an interface between one or more layers of the patch antenna 102. For example, the via 220a may be connected to the via 220b using the connection pad 222a positioned at an interface between the top laminate 106 and the middle laminate 104, etc.

Figure 8:
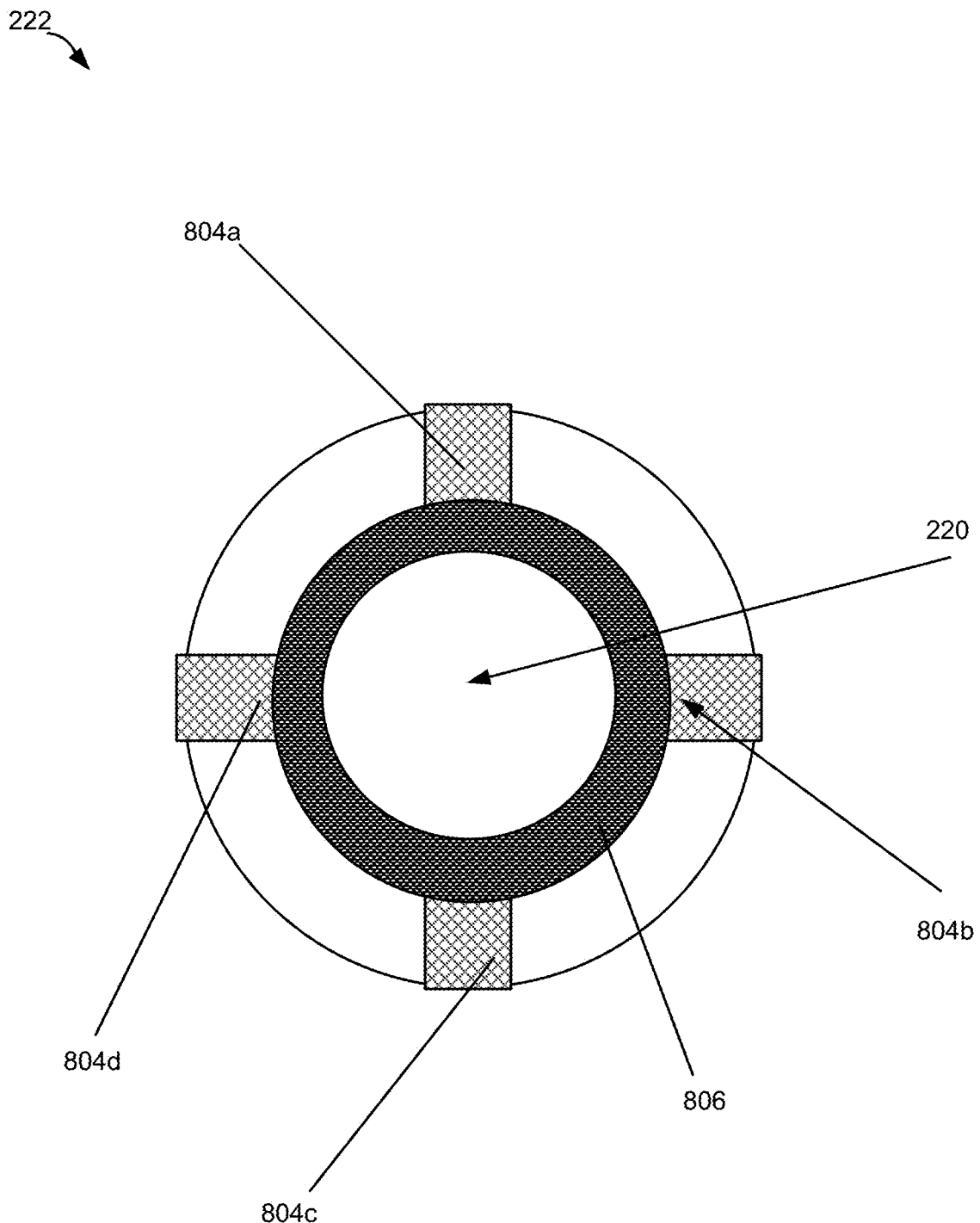
FIG. 8 depicts a diagram of a donut-shaped connection pad of the patch antenna of FIG. 2 according to an embodiment.

FIG. 8 is a diagram of a donut-shaped connection pad 222 of the patch antenna 102 according to an embodiment. As illustrated, the donut-shaped connection pad 222 can include an outer connection ring 802, spokes 804a-d, and a solder ring 806, though any other or additional components may be possible for the donut-shaped connection pad 222. The donut-shaped connection pad 222 may connect the via 220 to a separate object or component, such as another via, of the patch antenna 102. For example, the via 220 can be connected to the donut-shaped connection pad 222 on a first side of the donut-shaped connection pad 222, and a separate via, or other component, may be connected to the donut-shaped connection pad 222 on a second side opposite the first side of the donut-shaped connection pad 222.

The outer connection ring 802 may be or include an electrically conductive material such as copper, silver, aluminum, titanium, other metallic elements, alloys thereof, conductive polymers, or any combination thereof. In some embodiments, the outer connection ring 802 may be or include the same or similar electrically conductive material as the via 220. The outer connection ring 802 may be connected to each spoke of the spokes 804a-d. For example, the spoke 804a can be connected to the outer connection ring 802 at a first point, or along a first edge, and to the via 220 at a second point, the spoke 804b can be connected to the outer connection ring 802 at a third point or along a second edge, and to the via 220 at a fourth point, the spoke 804c can be connected to the outer connection ring 802 at a fifth point, or along a third edge, and to the via 220 at a sixth point, and the spoke 804d can be connected to the outer connection ring 802 at a seventh point, or along a fourth edge, and to the via 220 at an eighth point. Other suitable arrangements or permutations of the foregoing may be possible.

In some embodiments, the donut-shaped connection pad 222 can allow the via 220 and one or more other vias or other components to be mechanically affixed to one another, chemically affixed to one another, etc. The via 220 may be coupled with a separate via, or any other suitable component, using solder, epoxy, other suitable affixing techniques, or may otherwise be integrally formed with one another. The solder ring 806 may be or include a mask that may prevent solder or other affixing material from leaking into an interior portion of the via 220. Additionally, one or more spokes of the spokes 804a-d may include solder paste screened on to allow connections between the donut-shaped connection pad 222, the via 220, the separate via or other component, or any combination thereof, once solder is melted, once epoxy is applied, etc.

FIG. 9 is a flowchart of a process 900 for connecting vias with one or more connection pads to form a conduction pin 216 of the patch antenna 102 according to an embodiment. At block 902, laminates of the patch antenna 102 are formed. The laminates may include the top laminate 106, the middle laminate 104, the bottom laminate 202, and the like. The laminates may each or collectively be or include laminate material such as a dielectric material, a polymeric material, another non-conductive material, etc. Additionally, the laminates, or any subset thereof, may include one or more electrically conductive antenna elements. For example, the top laminate 106 can include the electrically conductive antenna element 112, the second electrically conductive antenna element 225, or a combination thereof. In a particular example, the top laminate 106 can include the electrically conductive antenna element 112 and the second electrically conductive antenna element 225 separated from one another by a dielectric material or other suitable laminate material.

Additionally, one or more of the laminates, such as the middle laminate 104 and/or the bottom laminate 202, may include one or more exterior surfaces, or portions thereof, that can be plated with an electrically conductive material. For example, the bottom laminate 202 may include the first component 210a that may include at least a portion of an exterior surface of the bottom laminate 202. The first component 210a may be plated with or may otherwise include the electrically conductive material. Additionally, the middle laminate 104 may include the second component 210b that may include at least a portion of an exterior surface of the middle laminate 104. The second component 210b may be plated with or may otherwise include the electrically conductive material. Examples of the electrically conductive material can include copper, silver, aluminum, titanium, other electrically conductive elements, any alloys thereof, or any combination thereof. Additionally, the laminates can include one or more channels (e.g., the channels 215a-c) that can extend from a first end (e.g., originating at the top laminate 106) of the patch antenna 102 to a second end (e.g., terminating at the bottom laminate 202) of the patch antenna 102.

At block 904, a set of conduction pins is positioned in the set of channels of the patch antenna 102. The set of conduction pins may include the same or similar number of conduction pins as a number of channels included in the set of channels. For example, if the patch antenna 102 includes four channels, then four conduction pins will be positioned in the four channels such that each conduction pin can be positioned in a different channel of the four channels. Additionally, each conduction pin of the set of conduction pins includes a set of vias that forms the respective conduction pin. A via may be or include a portion of the respective conduction pin. For example, a particular conduction pin may be formed by connecting three separate vias, though other suitable numbers (e.g., less than three or more than three) of vias are possible for forming the conduction pin, using one or more donut-shaped connection pads. In some examples, the set of conduction pins may be formed substantially contemporaneously with the laminates of the patch antenna 102, for example by plating holes drilled in the laminate.

At block 906, the respective set of vias can be coupled together using one or more donut-shaped connection pads to form a respective conduction pin. Each adjacent pair of vias of the respective vias may be connected together using a different connection pad of the one or more connection pads. For example, and in examples in which the set of vias include three vias, a first pair of vias can be connected using a first connection pad of the one or more connection pads, and a second pair of vias can be connected using a second connection pad of the one or more connection pads. In some embodiments, each connection pad of the one or more connection pads can include a set of spokes that can each be connected to an outer connection ring and to each via of the respective pair of vias. Connecting the respective set of vias together using the one or more connection pads may allow signals to be received and transmitted using the respective conduction pin as if the conduction pin were monolithic.

Various features described herein, e.g., methods, apparatus, computer-readable media and the like, can be realized using a combination of dedicated components, programmable processors, and/or other programmable devices. Processes described herein can be implemented on the same processor or different processors. Where components are described as being configured to perform certain operations, such configuration can be accomplished, e.g., by designing electronic circuits to perform the operation, by programming programmable electronic circuits (such as microprocessors) to perform the operation, or a combination thereof. Further, while the embodiments described above may make reference to specific hardware and software components, those skilled in the art will appreciate that different combinations of hardware and/or software components may also be used and that particular operations described as being implemented in hardware might be implemented in software or vice versa.

Specific details are given in the above description to provide an understanding of the embodiments. However, it is understood that the embodiments may be practiced without these specific details. In some instances, well-known circuits, processes, algorithms, structures, and techniques may be shown without unnecessary detail in order to avoid obscuring the embodiments.

While the principles of the disclosure have been described above in connection with specific apparatus and methods, it is to be understood that this description is made only by way of example and not as limitation on the scope of the disclosure. Embodiments were chosen and described in order to explain the principles of the invention and practical applications to enable others skilled in the art to utilize the invention in various embodiments and with various modifications, as are suited to a particular use contemplated. It will be appreciated that the description is intended to cover modifications and equivalents.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary. Patents, patent applications, publications, and descriptions mentioned here are incorporated by reference in their entirety for all purposes. None is admitted to be prior art.

What is claimed is:

1. A Global Navigation Satellite System (GNSS) patch antenna comprising:
   a plurality of layers with at least one layer of the plurality of layers including an electrically conductive antenna element configured to receive GNSS signals and another layer of the plurality of layers including a ground well;
   a plurality of channels aligned between the plurality of layers and extending through the plurality of layers; and
   a plurality of conduction pins located in the plurality of channels, each conduction pin of the plurality of conduction pins comprising a plurality of vias coupled by one or more donut-shaped connection pads at each interface between the plurality of layers, and each conduction pin of the plurality of conduction pins being electrically isolated from the ground well.

2. The GNSS patch antenna of claim 1, wherein the plurality of layers comprises:
   a middle laminate comprising a first side and a second side opposite the first side;
   a top laminate coupled to the middle laminate and positioned on the first side of the middle laminate; and
   a bottom laminate coupled to the middle laminate and positioned on the second side of the middle laminate, wherein exposed surfaces of the bottom laminate and at least an exposed portion of a surface of the second side of the middle laminate are plated with an electrically conductive material to form the ground well.

3. The GNSS patch antenna of claim 2, wherein each channel of the plurality of channels extends from an electrically conductive antenna element included in the top laminate to a first side of the bottom laminate positioned opposite a second side of the bottom laminate coupled to the second side of the middle laminate.

4. The GNSS patch antenna of claim 3, wherein the electrically conductive antenna element and each conduction pin of the plurality of conduction pins comprise an electrically conductive material, wherein the electrically conductive antenna element has a geometrical shape similar to a geometrical shape of the top laminate and is comprised of copper.

5. The GNSS patch antenna of claim 3, wherein the ground well increases a volume of the GNSS patch antenna to optimize a detectable frequency range associated with the GNSS patch antenna.

6. The GNSS patch antenna of claim 1, wherein each donut-shaped connection pad of the one or more donut-shaped connection pads comprises a solder ring arranged adjacent to and surrounding a respective via and a plurality of spokes, wherein each spoke of the plurality of spokes extends from the solder ring to an outer radius of the donut-shaped connection pad, and wherein an electrically conductive material included in the respective via is electrically coupled to the plurality of spokes.

7. The GNSS patch antenna of claim 1, wherein each conduction pin of the plurality of conduction pins is adjacent to but does not contact the ground well.

8. The GNSS patch antenna of claim 1, wherein each adjacent pair of vias included in the plurality of vias is connected to one another by a different connection pad of the one or more connection pads.

9. A Global Navigation Satellite System (GNSS) patch antenna comprising:
   a plurality of laminate layers with at least one laminate layer of the plurality of laminate layers including an electrically conductive antenna element configured to receive GNSS signals and another laminate layer of the plurality of laminate layers including a ground well; and
   a plurality of channels aligned between the plurality of layers and extending through the plurality of layers, the plurality of channels sized to receive a plurality of conduction pins, each conduction pin of the plurality of conduction pins comprising a plurality of vias coupled by one or more donut-shaped connection pads at each interface between the plurality of layers, and each conduction pin of the plurality of conduction pins being electrically isolated from the ground well.

10. The GNSS patch antenna of claim 9, wherein the plurality of laminate layers comprises:
    a middle laminate layer comprising a first side and a second side opposite the first side;
    a top laminate layer coupled to the middle laminate layer and positioned on the first side of the middle laminate layer; and
    a bottom laminate layer coupled to the middle laminate layer and positioned on the second side of the middle laminate layer, wherein exposed surfaces of the bottom laminate layer and at least an exposed portion of a surface of the second side of the middle laminate layer are plated with an electrically conductive material to form the ground well.

11. The GNSS patch antenna of claim 10, wherein each channel of the plurality of channels extends from the electrically conductive antenna element included in the top laminate layer to a first side of the bottom laminate layer positioned opposite a second side of the bottom laminate layer coupled to the second side of the middle laminate layer.

12. The GNSS patch antenna of claim 11, wherein the electrically conductive antenna element and each conduction pin of the plurality of conduction pins comprise an electrically conductive material, wherein the electrically conductive antenna element has a geometrical shape similar to a geometrical shape of the laminate layer and is comprised of copper.

13. The GNSS patch antenna of claim 11, wherein the ground well increases a volume of the GNSS patch antenna to optimize a detectable frequency range associated with the GNSS patch antenna.

14. The GNSS patch antenna of claim 9, wherein each donut-shaped connection pad of the one or more donut-shaped connection pads comprises a solder ring arranged adjacent to and surrounding a respective via and a plurality of spokes, wherein each spoke of the plurality of spokes extends from the solder ring to an outer radius of the donut-shaped connection pad, and wherein an electrically conductive material included in the respective via is electrically coupled to the plurality of spokes.

15. The GNSS patch antenna of claim 9, wherein each conduction pin of the plurality of conduction pins is adjacent to but does not contact the ground well.

16. The GNSS patch antenna of claim 9, wherein each adjacent pair of vias included in the plurality of vias is connected to one another by a different connection pad of the one or more connection pads.

17. A connection pad for a Global Navigation Satellite System (GNSS) patch antenna, the connection pad comprising:
    an outer connection ring having an inner radius and an outer radius; and
    a plurality of spokes, each spoke of the plurality of spokes coupled to and extending from the inner radius of the outer connection ring, wherein the plurality of spokes are configured to allow the connection pad to connect a pair of vias included in a conduction pin of the GNSS patch antenna, the connection pad configured to connect a first via of the conduction pin positioned in a first laminate to a second via of the conduction pin positioned in a second laminate of the GNSS patch antenna.

18. The connection pad of claim 17, further comprising a solder ring positioned on the inner radius of the outer connection ring.

19. The connection pad of claim 17, wherein each spoke of the plurality of spokes comprises a first end and a second end, wherein the first end of each spoke is coupled to the inner radius of the outer connection ring, and wherein the second end of each spoke of the plurality of spokes is coupled to an outer radius of the pair of vias of the conduction pin.

20. The connection pad of claim 17, wherein the outer connection ring is embedded in a transition region of the first laminate of the GNSS patch antenna.

* * * * *